US 8,020,126 B2

United States Patent
Shen et al.

(10) Patent No.: US 8,020,126 B2
(45) Date of Patent: Sep. 13, 2011

(54) LINKS AND CHAINS VERIFICATION AND VALIDATION METHODOLOGY FOR DIGITAL DEVICES

(75) Inventors: Zukang Shen, Richardson, TX (US); Tarik Muharemovic, Dallas, TX (US); Pierre Bertrand, Antibes (FR)

(73) Assignee: Texas Instruments Incorporated, Dallas, TX (US)

( * ) Notice: Subject to any disclaimer, the term of this patent is extended or adjusted under 35 U.S.C. 154(b) by 310 days.

(21) Appl. No.: 12/366,054

(22) Filed: Feb. 5, 2009

(65) Prior Publication Data

US 2009/0222777 A1  Sep. 3, 2009

(51) Int. Cl.
*G06F 17/50* (2006.01)
(52) U.S. Cl. .......................... 716/106; 703/20
(58) Field of Classification Search .................. 716/106; 703/20
See application file for complete search history.

(56) References Cited

U.S. PATENT DOCUMENTS

| | | | | |
|---|---|---|---|---|
| 6,678,645 B1* | 1/2004 | Rajsuman et al. | ............... | 703/20 |
| 6,823,497 B2* | 11/2004 | Schubert et al. | ............... | 716/106 |
| 7,647,583 B2* | 1/2010 | Zeidman et al. | ............... | 717/121 |
| 2004/0006584 A1* | 1/2004 | Vandeweerd | ................... | 709/107 |
| 2004/0133861 A1* | 7/2004 | Bollano et al. | .................... | 716/4 |
| 2005/0165597 A1* | 7/2005 | Nightingale | .................... | 703/27 |

* cited by examiner

*Primary Examiner* — Naum Levin
(74) *Attorney, Agent, or Firm* — Robert D. Marshall, Jr.; W. James Brady; Frederick J. Telecky, Jr.

(57) ABSTRACT

The links and chains (LNC) of this invention is an applications verification and validation (AVV) methodology. LNC is a hierarchical and systematic approach emphasizing conservation and reuse of effort expended. LNC creates objective metrics for validation. This invention ensures that the device will work in a system environment. LNC is an independent and complementary validation of the design before committing release to tape-out. The chip support library (CSL) and diagnostics used by LNC are natural outputs of the validation and are thus gating items to tape-out release. This ensures a fully tested device.

5 Claims, 6 Drawing Sheets

LINKS AND CHAINS VERIFICATION AND VALIDATION METHODOLOGY FOR DIGITAL DEVICES

TECHNICAL FIELD OF THE INVENTION

The technical field of this invention is circuit design for verification and validation.

BACKGROUND OF THE INVENTION

With increased levels of integration in silicon devices, it is now possible to have several central processing unit (CPU) cores, peripherals and memory subsystems in a single integrated device. These devices are called systems on a chip (SoC). Due to the complexity of the architecture and the device, it is not possible for the silicon designers to verify and validate the device without knowledge of the end application. The impact of not having a first-pass functional device can be extremely costly.

These costs include: the cost of processed wafers; the turn-around time in identifying a bug; the work in releasing a new silicon sample; and lost customer opportunities due to short time windows. Thus completing both verification and validation on the device before it has been committed to tape-out is mandatory.

Verification determines if the system being built matches the specifications by comparing system results to a model of correctness. Coverage-driven verification ensures the functional requirements of the specification are correct and the behavior described is complete and consistent.

Validation determines if the system being built is what is desired by comparing system results to end-customer requirements. Validation exerts influence over both the beginning and the end of the design cycle. Initially high level system models are validated. Later hardware accelerators are validated ensuring that the right system is being built.

The goals of any satisfactory verification and validation (V&V) are: a first pass functional device; the device works in the system for which it was developed; customer focus on value added work building on device capabilities and support software; not only composite device modules but also interactions between the modules under stress (maximum usage conditions) are validated.

Figure 1:
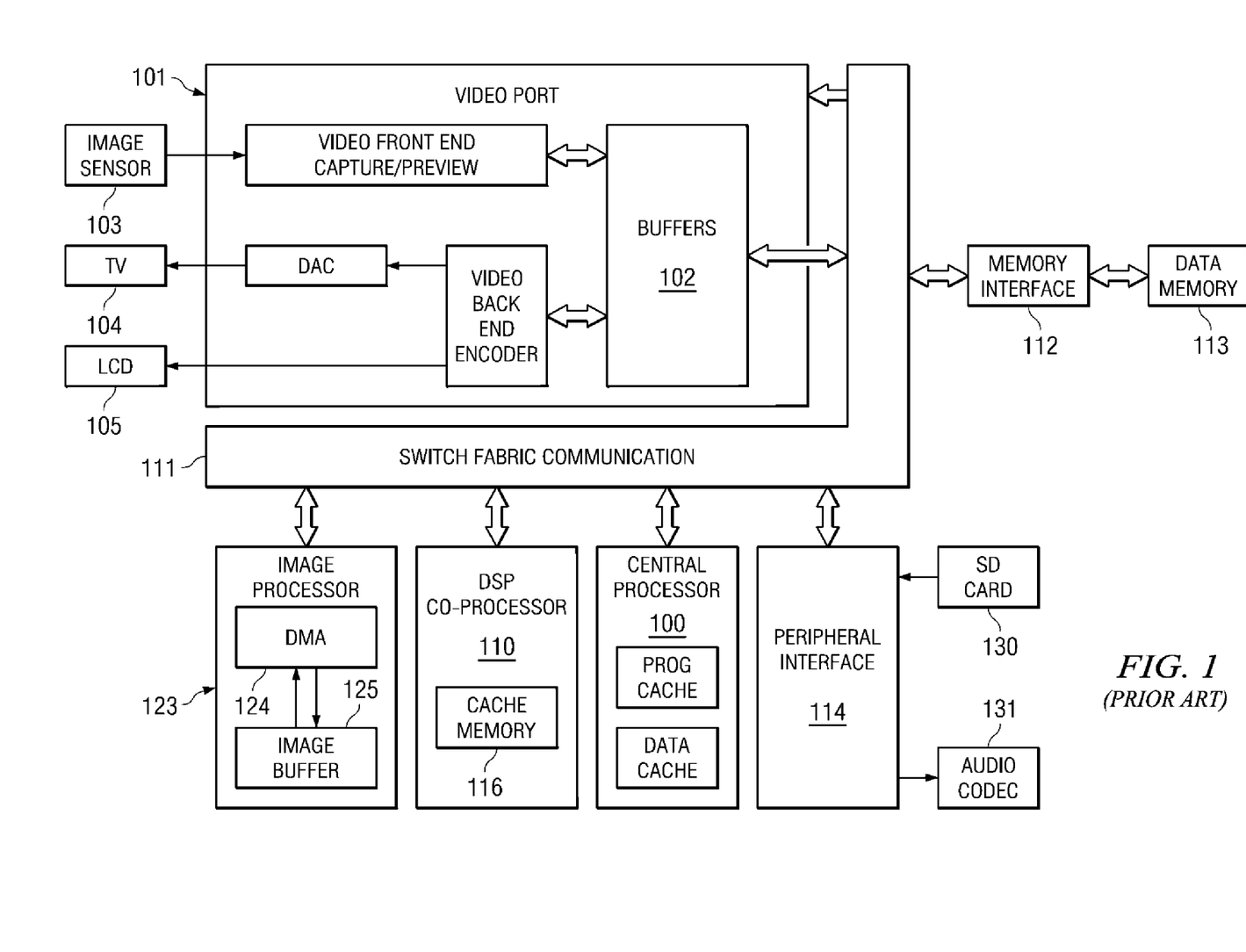
FIG. 1 illustrates a conventional processor block diagram (Prior Art)

Verification and validation has developed substantially since early work on general purpose processor devices. FIG. 1 illustrates an example of a conventional audio-video processor device. Central processing unit (CPU) 100 interfaces directly with program cache memory and data cache memory. Major blocks of the audio-video processor interface through switch fabric communication device 111. These blocks: include central processing unit 100; DSP co-processor 110; image processor 123; video port 101; memory interface 112; and peripheral interface 114. Each major block of the audio-video processor device of FIG. 1 is a megacell and each block separately receives conventional verification and validation. Blocks external to the audio-video processor include: image sensor 103; TV unit 104; liquid crystal display (LCD) 105; SD card 130; and audio codec 131. FIG. 1 also illustrates video port buffers 102, image processor DMA 124 and image buffer unit 125.

Figure 2:
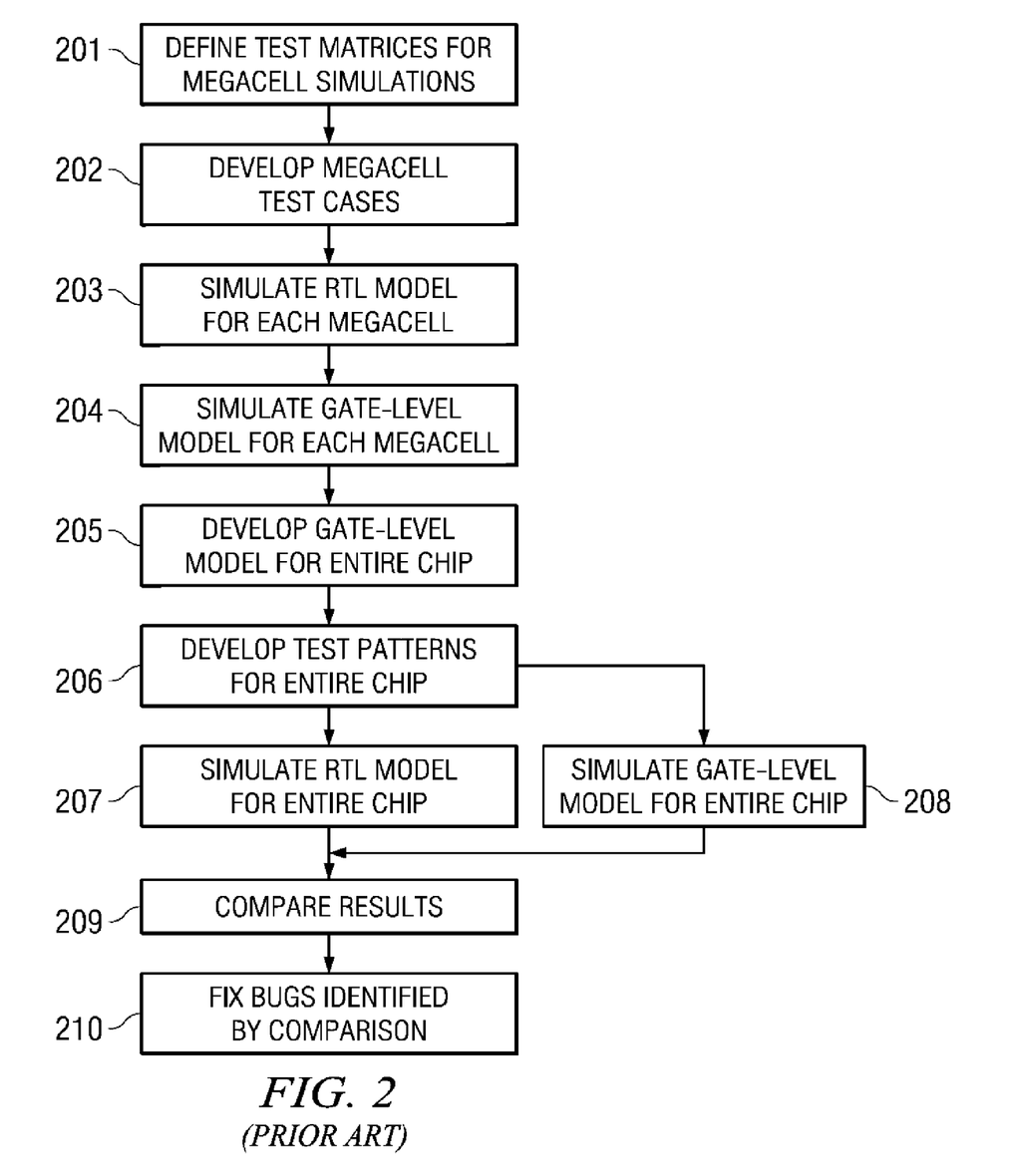
FIG. 2 illustrates the flow chart of verification and validation flow on a conventional processor device (Prior Art)

FIG. 2 illustrates a flow chart of a conventional verification and validation on the audio-video processor device of FIG. 1. Step 201 defines test matrices. These test matrices detail in table form all of the combinations of test conditions and input signals valid for each megacell simulation. Step 202 develops test cases to be covered by the megacell simulations for these test matrices. Step 203 simulates a RTL model for each megacell. Step 204 simulates a gate level model for each megacell. Step 205 develops a gate level model for the entire chip by compiling the gate level models of the magacells. Step 206 develops test patterns for the entire chip. Step 207 simulates an RTL model of the entire chip in parallel with step 208 which simulates a gate level model of the entire chip. Step 209 compare results of the gate-level model simulation of step 207 and the RTL model simulation or 208. Step 210 fixes bugs identified by comparison 209.

SUMMARY OF THE INVENTION

The links and chains (LNC) of this invention is an applications verification and validation (AVV) methodology. LNC is a hierarchical and systematic approach emphasizing conservation and reuse of effort expended. LNC creates objective metrics for validation. This invention ensures that the device will work in a system environment. LNC is an independent and complementary validation of the design before committing release to tape-out. The chip support library (CSL) and diagnostics used by LNC are natural outputs of the validation and are thus gating items to tape-out release. This ensures a fully tested device.

BRIEF DESCRIPTION OF THE DRAWINGS

These and other aspects of this invention are illustrated in the drawings, in which.

DETAILED DESCRIPTION OF PREFERRED EMBODIMENTS

The links and chains (LNC) of this invention are built on a hierarchy of test cases. These various test cases are building blocks that can be used to build more complex and complicated test scenarios without having to invest additional time in writing new code. Hierarchies of the tests include: module tests; links; chains; concurrent chains; nets; applets; transaction-oriented placebo; and applications. Thin invention blends a bottom-up approach and a top-down approach to identify, create and reuse test cases and associated software for testing.

The bottom-up approach views the architecture of the device and the various modules, building a set of test cases for the modules and for all paths between modules supported by hardware architecture. This often grows into a large set of test cases that might not be practical to verify them at a pre-silicon stage. Simulations are not fast enough or the verification platforms including such hardware simulators as Quickturn. Such simulations are accurate but not fast enough and are cumbersome to use.

Taking a top-down view of the application for which the device is targeted reduces the scope of test coverage and is the best approach is to take. This top-down view identifies those paths and modules most relevant and verifies them thoroughly. This enhances time to market by reducing the time for verification. The top-down approach also reveals the most important transactions between modules and the paths between them. The bottom-up and top-down blend to verify when the links defined in verifying the modules are reused in concurrent chains derived from the application.

The two most basic elements of the LNC methodology may be defined as follows:

A link is a transaction path traversed between two operational modules in a particular application scenario. An atomic link is the smallest link and is the base building block. A link is self-sufficient and used to build more complicated tests.

A chain is a more complex transaction path made up of two or more links. For example, one chain might be formed from four elements: the links between a peripheral device and memory; the CPU operating on this data; the CPU storing the data in synchronous dynamic random access memory (SDRAM); and the path between the SDRAM the peripheral device.

A concurrent chain is a more detailed representation of the application. A concurrent chain includes several chains executing in parallel. The data traffic generated by Concurrent Chains is normally more than or equal to what the actual end application would do.

A net is a complex concurrent chain used in architecture analysis of the device. The data traffic generated by a net is typically more than what an application would generate.

An applet is a small independent application. An applet can be a module, an algorithm or snippets of code that form an integral part of the end application. Some examples of applets are: an MP3 decoder; an echo cancellation operation; and an MPEG4 encoder.

A transaction oriented placebo (TOP) looks and performs exactly like an end application and has the same kind of data traffic. TOPs concentrate on the interactions between modules which are similar to what would exist within the device when running the application. A typical example is when packet pushers receive voice from one peripheral function and place it on the network.

Figure 3:
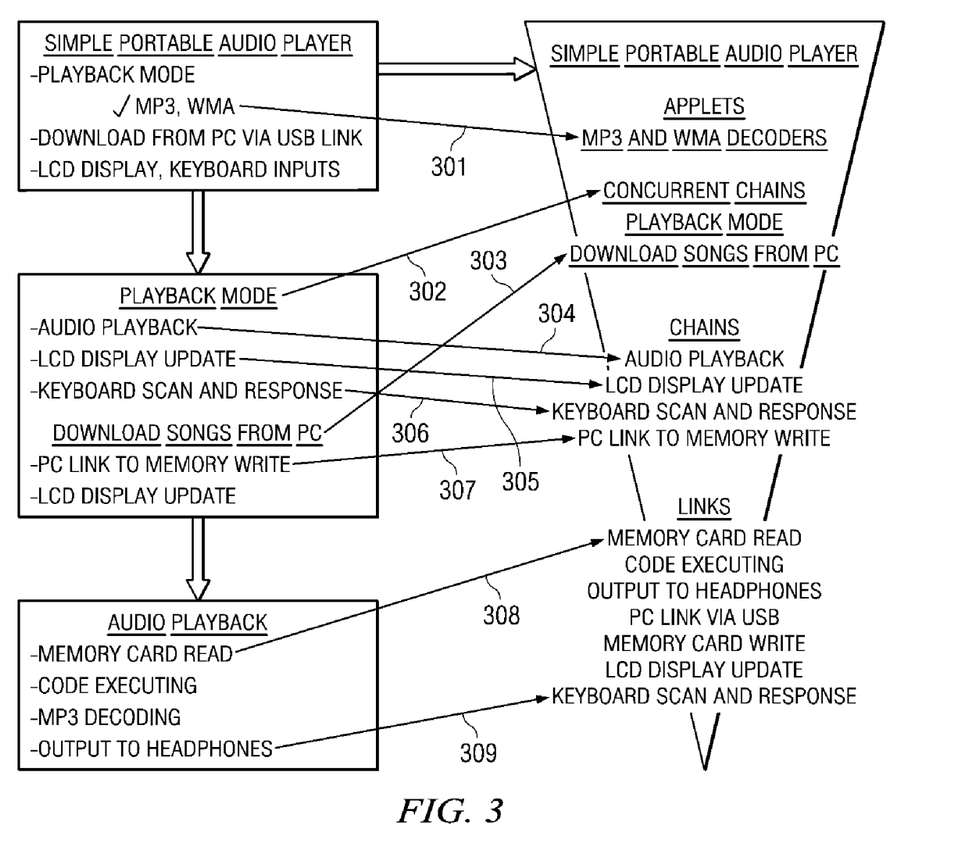
FIG. 3 illustrates the elements of the links and chains methodology of this invention applied to a simple portable audio player.

FIG. 3 illustrates the elements of links and chains methodology applied to a simple portable audio player. FIG. 3 illustrates applets 301 used to load the MP3 and WMA decoder from a direct MP3 or WMA source or alternately from a PC via USB link using LCD display and keyboard input. FIG. 3 illustrates playback mode including transactions involving concurrent chains 302 (playback mode) and 303 (download songs from PC), and simple chains 304 (audio playback), 305 (LCD display update), 306 (keyboard scan and response) and 307 (PC link to memory write). FIG. 3 illustrates additional audio playback features utilize links 308 (memory card read) and 309 (output to headphones).

Figure 4:
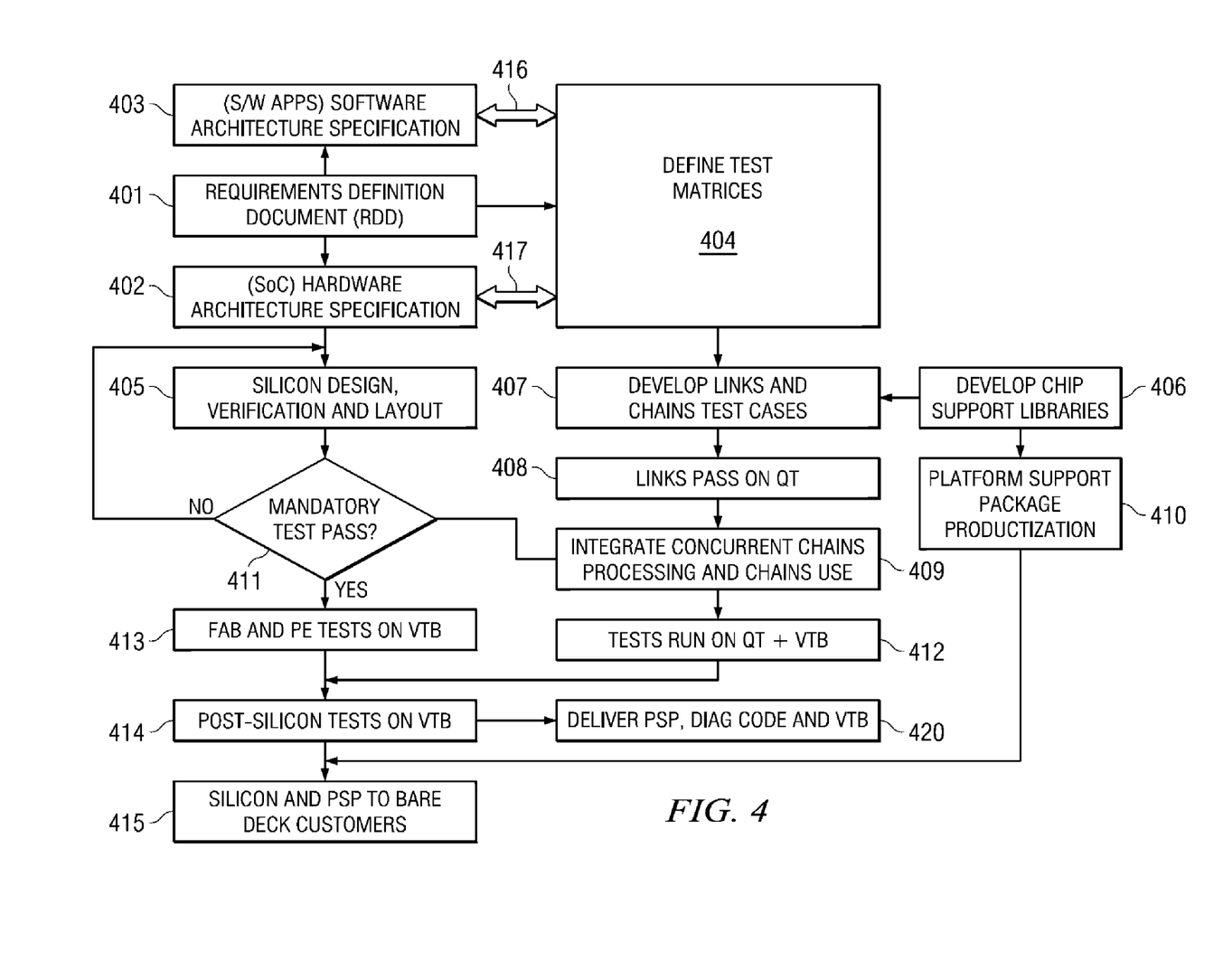
FIG. 4 illustrates the flow chart of verification and validation flow using the links and chains methods of this invention.

FIG. 4 illustrates a flow chart of verification and validation flow using the links and chains of this invention. Step 401 beings the flow with a requirements definition document. This requirements definition document specifies goals that must be met by device including silicon and software. Step 401 leads to step 402 creation of a hardware architecture for a system on chip (SoC) specification and step 403 creation of a software architecture specification for software applications to run on the system on chip (SoC).

Step 404 compiles test matrices and test plan documents for applications verification and validation (AVV) containing a description of the tests that will be performed. This includes: module level tests; links definition; chains definition; concurrent chains; and throughput nets definition. The content of block 404 comprehends both the S/W application software and the system on chip embedded software as shown by handshaking elements 416 and 417.

Step 405 implements design, verification and layout of the SoC. This proceeds in parallel with the AVV flow of steps 407 through 409. Step 406 develops chip support libraries. Step 410 develops the platform support package (PSP) containing drivers forming an integral part of the software. Step 407 develops the test cases defined in step 404. Step 408 tests the links on the verification platform which is generally a hardware simulator such as Quickturn. Step 409 integrates concurrent chain processing with the chains used.

Step 411 determines if the chains and concurrent chains from step 409 pass mandatory tests. If the chains and concurrent chains do not pass (No at step 411), then processing returns to step 405. Step 405 re-implements design, verification and layout of the SoC. The resultant new design is again subject to the mandatory test pass of step 411. If the chains and concurrent chains do pass (Yes at step 411), then processing advances to step 413.

The module test matrix defined in step 404 is a suite of tests that exercise all the modes of a particular module or megamodule. These tests will cover all the possible modes in which the module can be used. Step 412 verifies concurrent chains from step 409 on a hardware accelerator such as Quickturn (QT) and a verification test bench (VTB). Step 413 fabricates the SOCs (Fab) and provides production engineering tests (PE). Step 414 performs complete silicon tests. Step 415 delivers the fabricates SOCs and platform support package to the customer. Step 420 delivers the platform support package, diagnostic code and verification test bench to the customer.

The application hierarchy is the final software that will run on the device. This is delivered to the customer as the last part of solution to the problem of the application. Alternatively, the customer may write the software required by the device. Assuming that the module has been tested, the links are built. For the module every possible mode of operation is tested. Links target testing the module in modes that are relevant to the application.

All the tests are built on the chip support library (CSL) of step 406. The chip support library is a natural output of the verification. This ensures portability of the test cases across devices. Further, this ensures that if the same module is used in different devices it is not necessary to create a whole new set of test cases for the new device.

There are four types of views needed to identify the links and chains. These are: CPU-centric tests; source-Sink centric tests; bridge-centric tests; and bus-centric tests. CPU centric tests include all transaction paths and modules that can be reached by the CPU. For example, CPU-centric tests include memory read/writes from/to the CPU core. Source-sink tests identify all modules that can be accessed within the device from a peripheral source. Bridge-centric tests identify all the possible paths to and from the switch fabric communication device 111.

Figure 5:
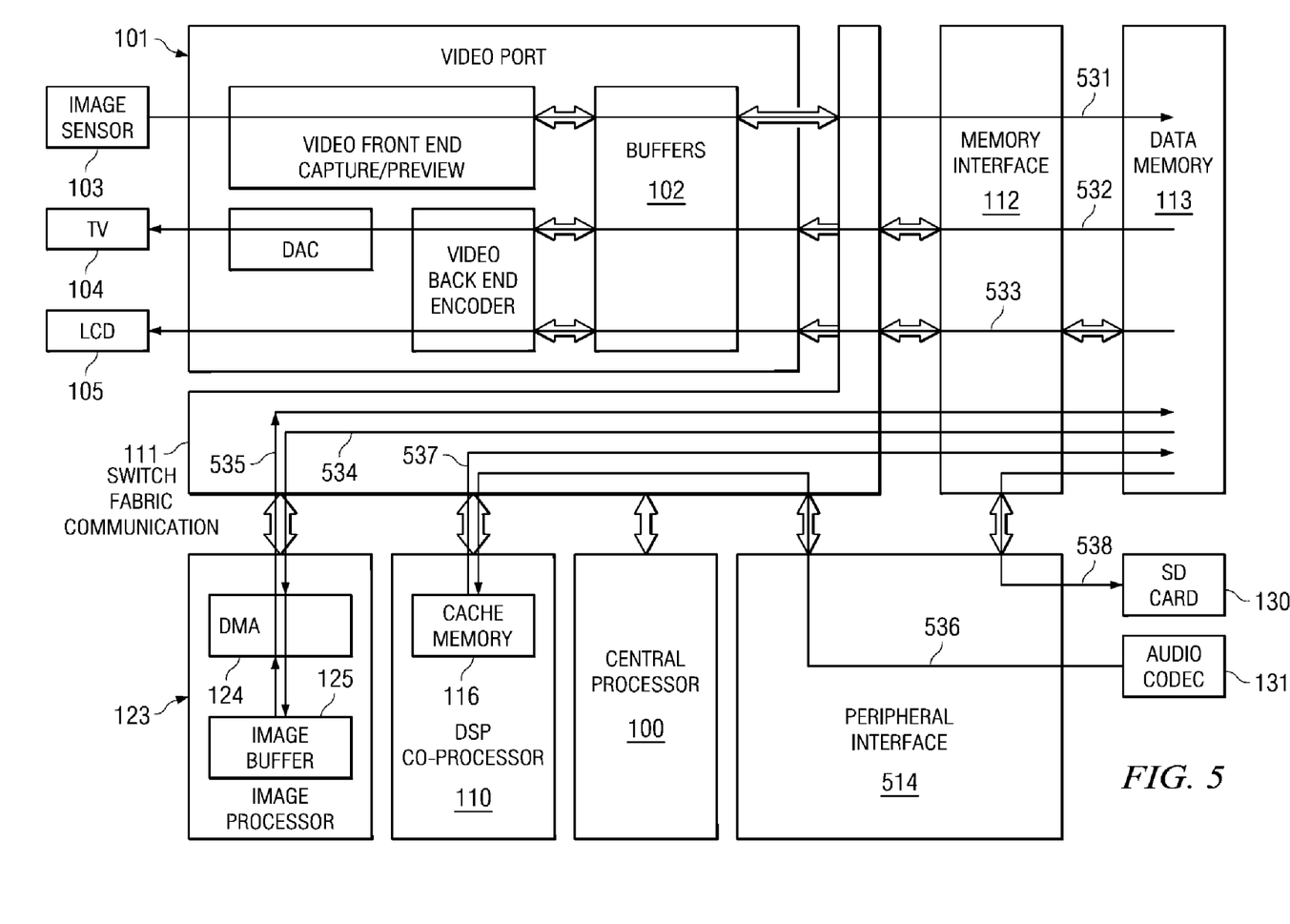
FIG. 5 illustrates data paths making up the movie capture links and chains for the audio-video processor device of FIG. 1.

FIG. 5 illustrates the links and chains included in a movie capture operation of the audio-video processor device of FIG. 1. Table 1 lists the individual data path descriptions forming chains in capture.

TABLE 1

| Chains | Description |
|---|---|
| 531 | Raw data from image sensor is processed through capture/preview engine to generate image data in external memory. |
| 532 | Video back end transfers image data from external memory to TV through digital to analog converter (DAC). |
| 533 | Video back end transfers image data from external memory to LCD. |
| 534 | Image processing block DMA transfers image data from external memory to image buffer. |
| 535 | Image processing block DMA transfers encoded video bitstream from image buffer to external memory. |
| 536 | Raw data from audio CODEC is transferred through peripheral interface to DSP co-processor cache memory. |
| 537 | Encoded audio bitstream is transferred from DSP co-processor cache memory to external memory. |
| 538 | Encoded movie is transferred from external memory to SD card. |

Figure 6:
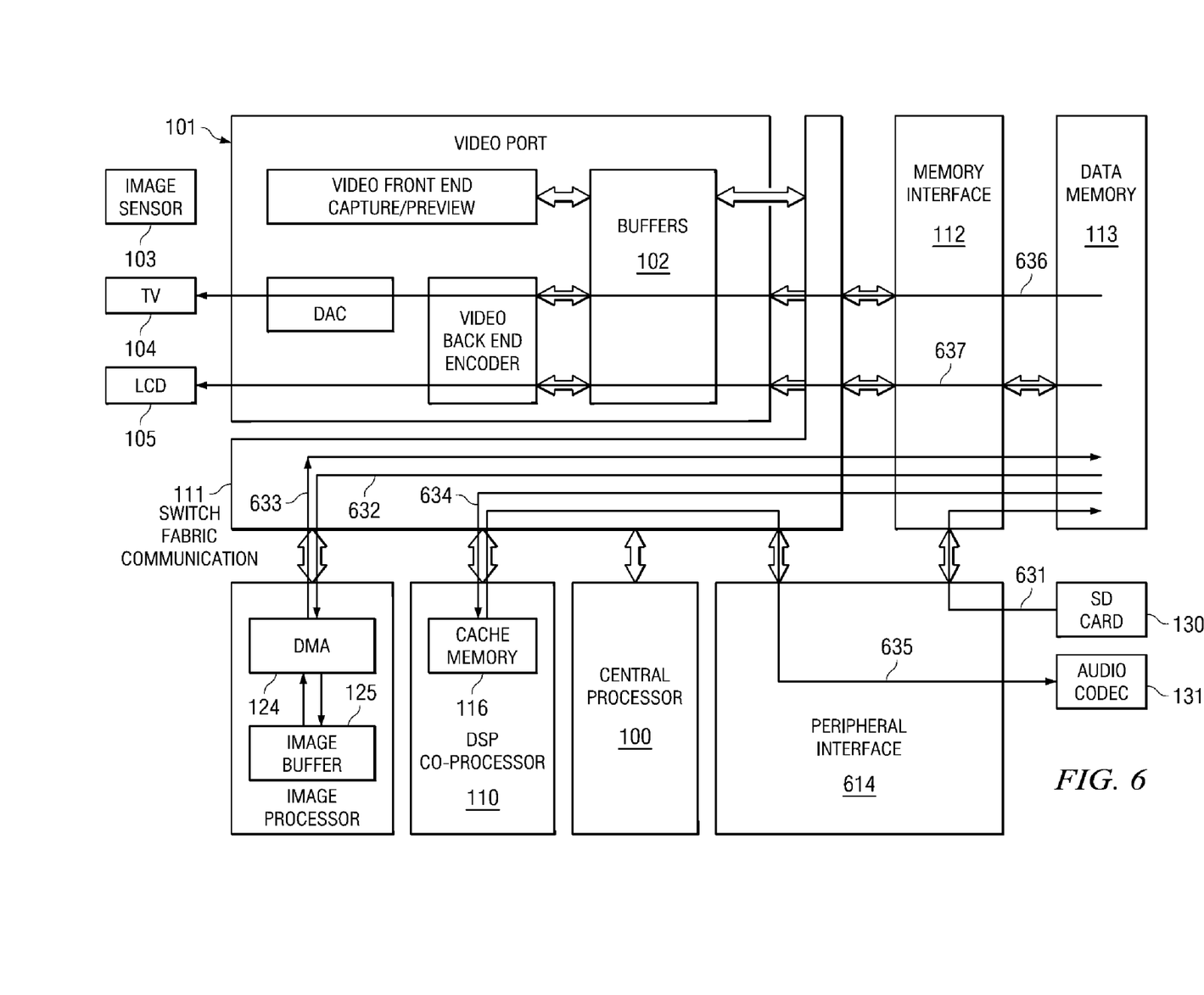
FIG. 6 illustrates the data paths making up the movie playback links and chains for the audio-video processor device of FIG. 1.

FIG. 6 illustrates the links and chains included in a movie playback operation of the audio-video processor device of FIG. 1. Table 2 lists the individual data path descriptions forming chains in playback.

TABLE 2

| Chains | Description |
|---|---|
| 631 | Encoded movie is transferred from SD card to external memory. |
| 632 | Image processing block DMA transfers video bitstream from external memory to image buffer. |
| 633 | Image processing block DMA transfers decoded image from image buffer to external memory. |
| 634 | Audio bitstream is transferred from external memory to DSP co-processor cache memory. |
| 635 | Decoded audio data is transferred from DSP co-processor cache memory to audio CODEC through peripheral interface. |
| 636 | Video back end transfers image data from external memory to TV through digital to analog converter (DAC). |
| 637 | Video back end transfers image data from external memory to LCD. |

What is claimed is:

1. A method of verification and validation of an electronic circuit design comprising the steps of:
defining operational requirements for the electronic circuit;
defining hardware architecture to support said defined operational requirements;
defining software architecture to support said defined operational requirements;
defining a test matrix to test said defined hardware architecture and said defined software architecture;
defining at least one applet consisting of an independent data processing application to be performed by the electronic circuit corresponding to said defined operational requirements;
defining at least one chain consisting of a transaction between at least two portions of said defined hardware architecture;
testing said defined hardware architecture and said defined software architecture according to said test matrix for each of said at least one chain as implemented on said defined hardware architecture and said defined software architecture;
if said testing fails, redefining said hardware architecture and repeating said testing step;
if said testing passes, fabricating a system on chip (SOC) electronic circuit corresponding to said defined hardware architecture and providing production engineering tests for said SOC.

2. The method of claim 1, further comprising the step of:
developing a circuit support library of subroutines to operate on said SOC electronic circuit; and
said steps of defining at least one applet and defining at least one chain employ said circuit support library.

3. The method of claim 2, further comprising the step of:
developing a platform support package consisting of software drivers to be used by said SOC electronic circuit employing said circuit support library.

4. The method of claim 1, further comprising the steps of:
testing said at least one applet and said least one chain employing a hardware simulator; and
if said testing fails, redefining said at least one applet and said at least one chain.

5. The method of claim 4, further comprising the steps of:
developing SOC electronic circuit tests corresponding to said at least one applet and said at least one chain.

* * * * *

UNITED STATES PATENT AND TRADEMARK OFFICE
CERTIFICATE OF CORRECTION

| | |
|---|---|
| PATENT NO. | : 8,020,126 B2 |
| APPLICATION NO. | : 12/366054 |
| DATED | : September 13, 2011 |
| INVENTOR(S) | : Basavaraj I Pawate and Ebenezer Vidyasagar |

It is certified that error appears in the above-identified patent and that said Letters Patent is hereby corrected as shown below:

On the front of the patent, please make changes as noted below and shown on the new title page attached (75) Inventors: Basavaraj I Pawate, Sugar Land, TX
Ebenezer Vidyasagar, Houston, TX Signed and Sealed this
Twenty-eighth Day of February, 2012

David J. Kappos
*Director of the United States Patent and Trademark Office*

(12) United States Patent
Pawate et al.

(10) Patent No.: US 8,020,126 B2
(45) Date of Patent: Sep. 13, 2011

(54) LINKS AND CHAINS VERIFICATION AND VALIDATION METHODOLOGY FOR DIGITAL DEVICES

(75) Inventors: Basavaraj I Pawate, Sugar Land, TX (US); Ebenezer Vidyasagar, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 310 days.

(21) Appl. No.: 12/366,054

(22) Filed: Feb. 5, 2009

(65) Prior Publication Data
US 2009/0222777 A1 Sep. 3, 2009

(51) Int. Cl.
*G06F 17/50* (2006.01)
(52) U.S. Cl. .................................. 716/106; 703/20
(58) Field of Classification Search ............. 716/106; 703/20
See application file for complete search history.

(56) References Cited

U.S. PATENT DOCUMENTS

| | | | |
|---|---|---|---|
| 6,678,645 B1 * | 1/2004 | Rajsuman et al. | 703/20 |
| 6,823,497 B2 * | 11/2004 | Schubert et al. | 716/106 |
| 7,647,583 B2 * | 1/2010 | Zeidman et al. | 717/121 |
| 2004/0006584 A1 * | 1/2004 | Vandeweerd | 709/107 |
| 2004/0133861 A1 * | 7/2004 | Bollano et al. | 716/4 |
| 2005/0165597 A1 * | 7/2005 | Nightingale | 703/27 |

* cited by examiner

*Primary Examiner* — Naum Levin
(74) *Attorney, Agent, or Firm* — Robert D. Marshall, Jr.; W. James Brady; Frederick J. Telecky, Jr.

(57) ABSTRACT

The links and chains (LNC) of this invention is an applications verification and validation (AVV) methodology. LNC is a hierarchical and systematic approach emphasizing conservation and reuse of effort expended. LNC creates objective metrics for validation. This invention ensures that the device will work in a system environment. LNC is an independent and complementary validation of the design before committing release to tape-out. The chip support library (CSL) and diagnostics used by LNC are natural outputs of the validation and are thus gating items to tape-out release. This ensures a fully tested device.

5 Claims, 6 Drawing Sheets